United States Patent
He et al.

(10) Patent No.: US 9,880,232 B2
(45) Date of Patent: Jan. 30, 2018

(54) MAGNETIC SENSOR MANUFACTURING

(75) Inventors: Qing He, Plymouth, MN (US); Wonjoon Jung, Eden Prairie, MN (US); Mark William Covington, Edina, MN (US); Mark Thomas Kief, Lakeville, MN (US); Yonghua Chen, Bloomington, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 810 days.

(21) Appl. No.: 13/419,728

(22) Filed: Mar. 14, 2012

(65) Prior Publication Data
US 2013/0244192 A1    Sep. 19, 2013

(51) Int. Cl.
| | | |
|---|---|---|
| *B05D 3/02* | (2006.01) | |
| *B05D 3/10* | (2006.01) | |
| *F27D 3/00* | (2006.01) | |
| *G01R 33/00* | (2006.01) | |
| *G01R 33/09* | (2006.01) | |
| *G11B 5/31* | (2006.01) | |
| *G11B 5/23* | (2006.01) | |

(52) U.S. Cl.
CPC ....... *G01R 33/0052* (2013.01); *G01R 33/093* (2013.01); *G01R 33/098* (2013.01); *G11B 5/23* (2013.01); *G11B 5/232* (2013.01); *G11B 5/3133* (2013.01); *G11B 5/3143* (2013.01); *G11B 5/3163* (2013.01); *Y10T 29/49043* (2015.01); *Y10T 29/49044* (2015.01)

(58) Field of Classification Search
CPC .. G01R 33/052; G01R 33/093; G01R 33/098; G11B 5/23; G11B 5/232; G11B 5/3133; G11B 5/3143; G11B 5/3163; Y10T 29/49043; Y10T 29/49044

USPC ............... 432/9, 10; 428/811.2, 800–816; 427/130, 127; 360/324, 324.1; 29/603.01, 603.07, 603.08, 603.13
See application file for complete search history.

(56) References Cited

U.S. PATENT DOCUMENTS

2006/0098354 A1 * 5/2006 Parkin ................ 360/324.2
2008/0158471 A1   7/2008 Lin
2008/0158741 A1 * 7/2008 Lin ................... 360/324.11
(Continued)

FOREIGN PATENT DOCUMENTS

| EP | 2639593 A1 | 7/2013 |
|---|---|---|
| JP | H06-29589 | 2/1994 |

(Continued)

OTHER PUBLICATIONS

European Search Report of European Application No. EP 13/159039, dated Jul. 23, 2013, 14 pages.
(Continued)

*Primary Examiner* — Alissa Tompkins
*Assistant Examiner* — Benjamin W Johnson
(74) *Attorney, Agent, or Firm* — Holzer Patel Drennan

(57) ABSTRACT

A magnetic sensor comprising a first shield and a second shield and a sensor stack between the first and the second shield, the sensor stack having a plurality of layers wherein at least one layer is annealed using in-situ rapid thermal annealing. In one implementation of the magnetic sensor a seed layer is annealed using in-situ rapid thermal annealing. Alternatively, one of a barrier layer, an antiferromagnetic (AFM) layer, and a cap layer is annealed using in-situ rapid thermal annealing.

7 Claims, 5 Drawing Sheets

(56) References Cited

U.S. PATENT DOCUMENTS

| | | | |
|---|---|---|---|
| 2008/0253039 A1 | 10/2008 | Nagamine et al. | |
| 2009/0162698 A1* | 6/2009 | Fukuzawa et al. | 428/811.2 |
| 2009/0180215 A1* | 7/2009 | Ishikawa et al. | 360/313 |
| 2009/0324814 A1* | 12/2009 | Parkin | H01L 43/08 427/131 |
| 2010/0195246 A1* | 8/2010 | Hashimoto | G11B 5/8404 360/110 |
| 2012/0193071 A1 | 8/2012 | Tsunekawa et al. | |

FOREIGN PATENT DOCUMENTS

| | | |
|---|---|---|
| JP | 2003-069113 | 3/2003 |
| JP | 2007-173809 | 7/2007 |
| JP | 2008-091484 | 4/2008 |
| JP | 2009-016966 | 1/2009 |
| WO | 2005-008799 | 1/2005 |
| WO | 2007-072987 A1 | 6/2007 |
| WO | 2010-150590 | 12/2010 |

OTHER PUBLICATIONS

Ma Q L et al., "Annealing Temperature and Co Layer Thickness Dependence of Magnetoresistance Effect for L1_0-MnGa/Co/MgO/CoFeB Perpendicular Magnetic Tunnel Junctions," IEEE Transactions on Magnetics, IEEE Service Center, New York, NY, US, vol. 48, No. 11, Nov. 1, 2012, 4 pages.

Nagasaka et al., "CPP-GMR Technology for Future High-Density Magnetic Recording," Fujitsu Sci. Tech. J. 42, 1 p. 149-157 (Jan. 2006).

Wang et al., "Understanding tunneling magnetoresistance during thermal annealing in MgO-based junctions with CoFeB electrodes," Physical Review B 81. 144406—pp. 1-6, Apr. 7, 2010.

Ikeda et al., "Tunnel magnetoresistance of 604% at 300 K by suppression of Ta diffusion in CoFeB/MgO/CoFeB pseudo-spin-valves annealed at high temperature," Applied Physics Letters 93, 082508, 3 pages, Aug. 29, 2008.

* cited by examiner

MAGNETIC SENSOR MANUFACTURING

BACKGROUND

In a magnetic data storage and retrieval system, a magnetic read/write head typically includes a reader portion having a magnetoresistive (MR) sensor for retrieving magnetically encoded information stored on a magnetic disc. Magnetic flux from the surface of the disc causes rotation of the magnetization vector of a sensing layer of the MR sensor, which in turn causes a change in electrical resistivity of the MR sensor. The change in resistivity of the MR sensor can be detected by passing a current through the MR sensor and measuring a voltage across the MR sensor. External circuitry then converts the voltage information into an appropriate format and manipulates that information as necessary to recover the information encoded on the disc.

SUMMARY

Implementations described and claimed herein provide a sensor stack including at least one layer that is annealed using rapid thermal annealing after its deposition. In one implementation of the magnetic sensor a seed layer is annealed using in-situ rapid thermal annealing. Alternatively, one of a barrier layer, an AFM layer, and a cap layer is annealed using in-situ rapid thermal annealing.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

These and various other features and advantages will be apparent from a reading of the following detailed description.

BRIEF DESCRIPTIONS OF THE DRAWINGS

DETAILED DESCRIPTIONS

Figure 1:
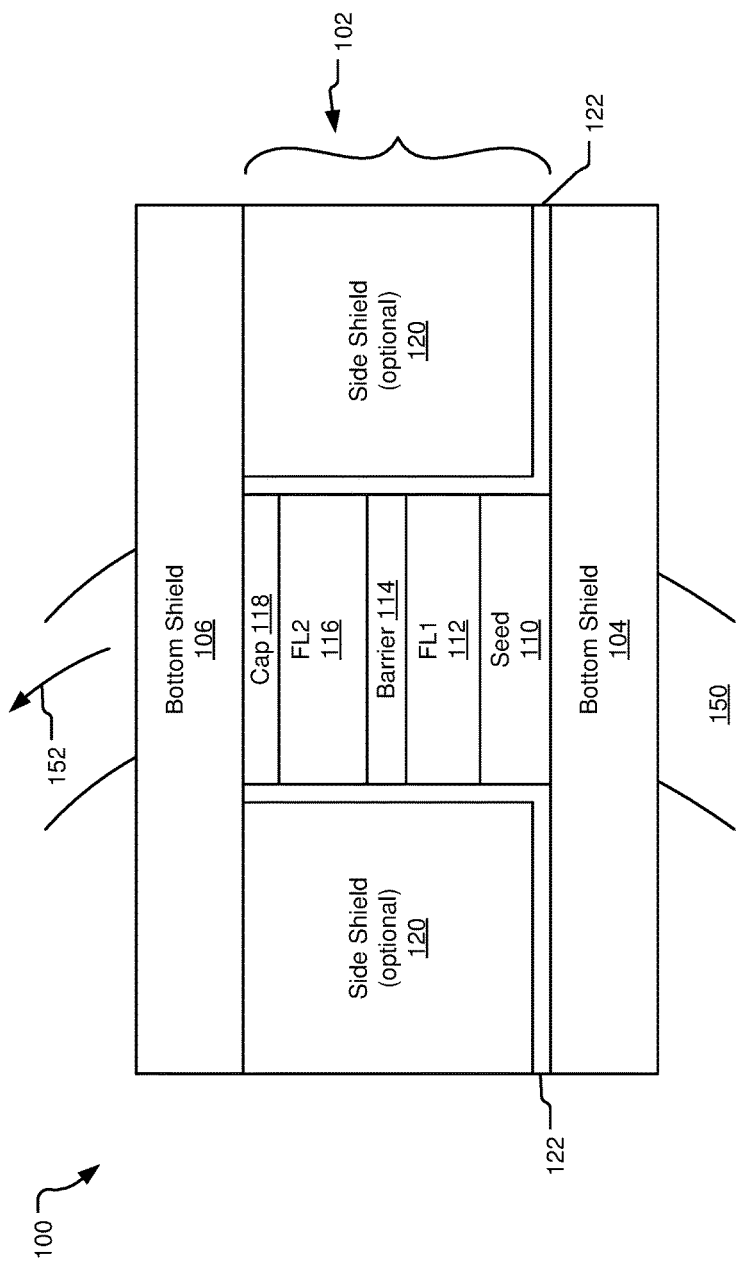
FIG. 1 illustrates a schematic block diagram illustrating an example read head including a megnetoresistive sensor.

There is an ever increasing demand for high data densities that require sensitive sensors to read data from a magnetic media. Thin film magnetoresistive (MR) multilayers form the heart of MR readers and their quality has a very strong impact on reader performance. For example, improvements in the MgO barriers and combined magnetic tunnel junction (MTJ) stack contributes significant signal to noise (SNR) gains that helps to close the performance gaps for product platforms. One method for improving the SNR and to reduce track misregistration values is to process materials at temperatures higher than room temperature by using an annealing process.

Annealing is a heat treatment process that causes alternation in a material, causing changes in the property of the material, such as strength and hardness. Metallurgical annealing may include generating conditions for heating a material to above the recrystallization temperature of the material, maintaining a stable temperature above the recrystallization temperature of the material, and cooling the material. Such annealing process may be used to induce ductility, to soften material, to relieve internal stresses, to make the structure of the material more homogeneous, etc., for one or more layers of a sensor stack. For example, in one implementation of the process of manufacturing MR sensors a film is deposited on to wafers at elevated temperatures and an ex-situ post-deposition vacuum anneal is performed. Such manufacturing process leads to higher quality MgO barriers. However, ex-situ vacuum anneal is a slow process requiring slow ramp-up and slow ramp-down. As a result, the process of manufacturing MR sensor stack is delayed when such ex-situ vacuum annealing is used. On the other hand, using in-situ thermal anneal requiring longer ramp-up periods may result in diffusion of material across layers of the sensor stack.

In an implementation of the process of manufacturing MR sensor stack disclosed herein, an in-situ rapid thermal anneal is inserted into one or more places during a deposition sequence. In situ thermal annealing is generally not used in recording head fabrication for a number of reasons. Specifically, when wafer processing is done at room temperature, any necessary high temperature processing is handled by ex-situ annealing in batch anneal ovens. Such separate processing provides simple and efficient manufacturing process. However, as the demand for the recording devices performance has increased, such devices require performance improvements. The methods described herein provide in-situ rapid thermal annealing configured to work with various sensor stack structures. Using in-situ rapid thermal annealing during the manufacturing of sensor stack results in higher quality sensor stacks that exhibit higher tunneling magnetoresistance (TMR) and better stability.

In one implementation, an in-situ rapid thermal anneal (RTA) module is used to provide in-situ thermal annealing. The RTA module may be docked onto the sensor stack tool to allow for in-situ thermal anneal during any part of the stack deposition sequence. Furthermore, the RTA module also allows a magnetic field that allows for field cooling. Such in-situ RTA does not require first ramping up of the temperature of the material to be annealed over long time period and it requires shorter soak time for cooling the material after heat induced annealing.

Another implementation uses a heated chuck with electrostatic wafer clamping that can heat wafers in-situ. In an alternative implementation, the RTA module can be docked on to a reader stack tool to provide in-situ thermal annealing at any part of stack deposition sequence. Thus, such implementation allows thermal annealing of a seed layer of the reader stack, a barrier layer of the reader stack, a cap layer of the reader stack, etc. Such implementation of the RTA module allows rapid heat transfer to a particular layer of the reader stack. Furthermore, such RTA module also provides a magnetic field that allows for in the field cooling of an annealed layer of the reader stack.

In an example implementation, a seed layer of a sensor stack is annealed at high temperature. For example, such high temperature annealing of the seed layer can be used in situations where subsequent layers of a sensor stack, such as layers of current perpendicular to plane giant magnetoresistive (CPP GMR) stacks, cannot be subjected to high temperatures. In an alternative implementation, different variations of the in-situ thermal anneal can be applied to the layers around a tunnel barrier layer of a sensor stack, such as an MgO tunnel barrier layer of a sensor stack. For example, annealing the bottom electrode of the tunnel barrier layer, annealing after the tunnel barrier layer is deposited, annealing after the top electrode of the tunnel barrier layer is deposited, etc. Yet alternatively, the in-situ thermal anneal may be applied at the end of the sensor stack sequence in order to exploit the fast thermal cycling.

FIG. 1 illustrates a schematic block diagram illustrating an air-bearing surface (ABS) view of a tri-layer read head 100 including a megnetoresistive sensor 102 manufactured using in-situ thermal annealing disclosed herein. Specifically, the sensor stack 102 is situated between a bottom shield 104 and a top shield 106. The megnetoresistive sensor 102 includes a seed layer 110 that is located at the bottom of the sensor stack 102. The seed layer 110 is deposited after etching a clean wafer surface using a plasma beam etching or ion-beam etching. In one implementation, after the seed layer 110 is deposited, it is annealed using in-situ thermal annealing. In one example implementation, the seed layer 110 is an antiferromagnetic (AFM) seed layer.

The megnetoresistive sensor 102 also includes a first free layer (FL1) 112 adjacent to the seed layer 110. In one implementation, the free layer 112 is not exchange coupled to an antiferromagnet. As a result, the magnetic moment of the free layer 112 is free to rotate under the influence of an applied magnetic field in a range of interest. The megnetoresistive sensor 102 further includes a tunneling barrier layer 114. In one implementation, the barrier layer 114 is an MgO barrier that provides magnetic tunnel junction (MTJ). In an alternative implementation the barrier layer is a metallic spacer that provides current perpendicular to plane giant magnetoresistance (CPP GMR). The barrier layer 114 is deposited at either room temperature or at higher temperatures in the range of 200 to 400 degree centigrade. Yet alternatively, the MgO barrier of the barrier layer 114 is broken up into a sequence of Mg, MgO, and Mg depositions. Such barrier layer 114 using Mg/MgO/Mg depositions is suited for use with low resistance area (RA) tunnel junctions.

The barrier layer 114 may be annealed using in-situ thermal annealing mechanism. Furthermore, subsequent to the in-situ thermal annealing, the barrier layer 114 is cryo-cooled. Subsequently, a second free layer (FL2) 116 is deposited on top of the barrier layer 114. Thus, the barrier layer 114 in effect separates the first free layer FL1 112 from the second free layer FL2 116. A cap layer 118 is deposited on top of the second free layer FL2 116. In one implementation, after the cap layer 118 is treated using thermal in-situ annealing process.

The read head 100 may optionally include side shields 120, which are insulated from the sensor stack 102 using insulation layers 122. The read head 100 is configured to fly over the surface of a disc drive data discs on an air bearing created by the rotation of the data discs. The data discs have a plurality of data tracks 150, one of which is shown in FIG. 1. The tracks 150 are divided into a plurality of bits. As the disc rotates in the direction of the arrow 152, the read head 100 follows a data track 150 and reads one or more bits as it passes under megnetoresistive sensor 102.

Figure 2:
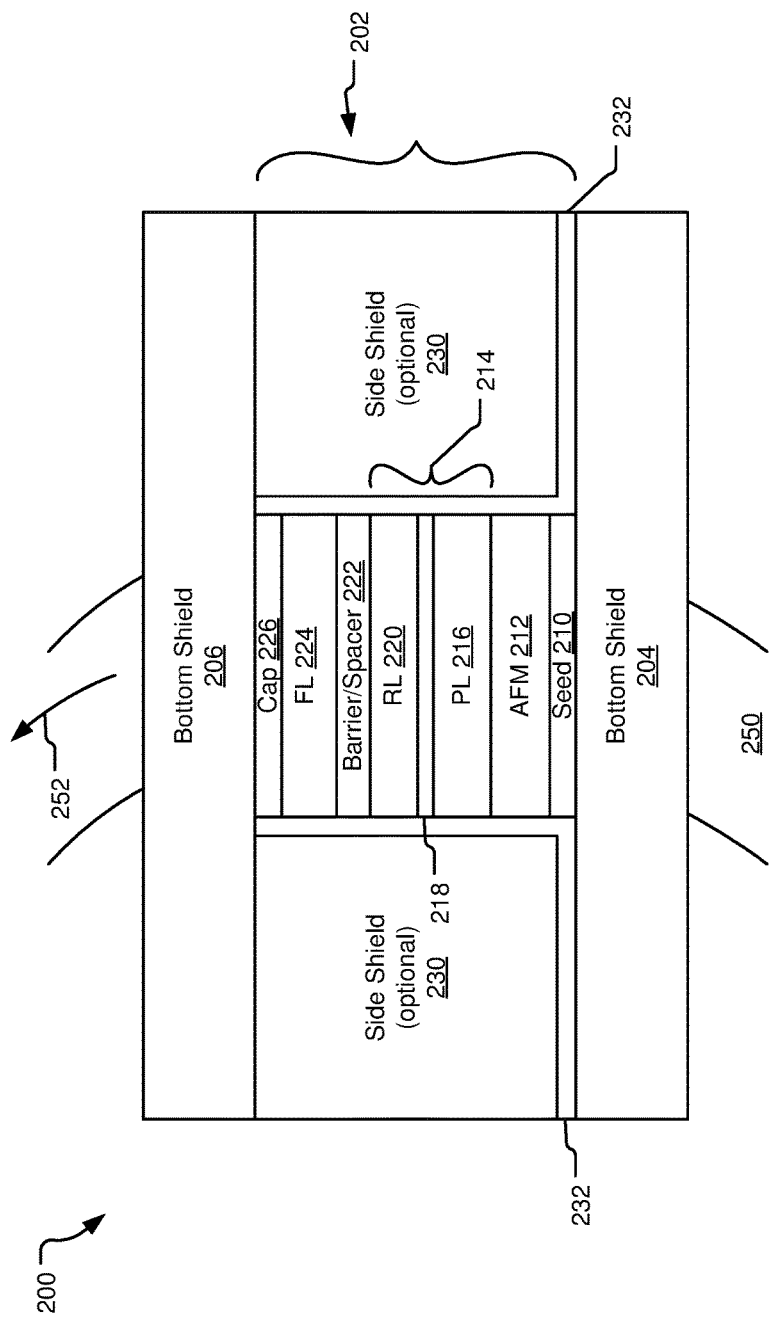
FIG. 2 illustrates an alternative schematic block diagram illustrating an example read head including a megnetoresistive sensor.

FIG. 2 illustrates a schematic block diagram illustrating an air-bearing surface (ABS) view of a high magnetoresistive barrier read head 200 including a megnetoresistive sensor 202 manufactured using in-situ thermal annealing disclosed herein. Specifically, the sensor stack 202 is situated between a bottom shield 204 and a top shield 206. The megnetoresistive sensor 202 includes a seed layer 210 that is located at the bottom of the sensor stack 202. The seed layer 210 is deposited after etching a clean wafer surface using a plasma beam etching or ion-beam etching. In one implementation, after the seed layer 210 is deposited, it is annealed using in-situ thermal annealing.

The megnetoresistive sensor 202 also includes an AFM layer 212 deposited on the seed layer 210. The AFM layer 212 may be an IrMn layer. Subsequently, the AFM layer 212 is annealed using an in-situ thermal anneal process. A part or all of a CoFe PL layer 216 is deposited on the annealed AFM layer 212. In one implementation, the PL layer 216 is also annealed using an in-situ thermal anneal process.

The CoFe pinning layer (PL) layer 216 is part of a synthetic antiferromagnetic (SAF) layer 214. In one implementation remainder of the SAF layer 214, includes an Ru layer 218 and a reference layer (RL) layer 220 deposited on top of the CoFe PL layer 216. The magnetoresistive sensor 202 further includes a barrier layer 222. In one implementation, the barrier layer 222 is an MgO barrier that provides magnetic tunnel junction (MTJ). In an alternative implementation the barrier layer 222 is a metallic spacer that provides current perpendicular to plane giant magnetoresistance (CPP GMR). The barrier layer 222 is deposited at either room temperature or at higher temperatures in the range of 200 to 400 degree centigrade. Yet alternatively, the MgO barrier of the barrier layer 222 is broken up into a sequence of Mg, MgO, and Mg depositions. Such barrier layer 222 using Mg/MgO/Mg depositions is suited for use with low resistance area (RA) tunnel junctions.

The barrier layer 222 may be annealed using in-situ thermal annealing mechanism. Furthermore, subsequent to the in-situ thermal annealing, the barrier layer 222 is cryo-cooled. Subsequently, a free layer (FL) 224 is deposited on top of the barrier layer 222. A cap layer 226 is deposited on top of the free layer FL 224. In one implementation, after the cap layer 226 is treated using thermal in-situ annealing process.

The read head 200 includes side shields 230, which are insulated from the sensor stack 202 using insulation layers 232. The read head 200 is configured to fly over the surface of a disc drive data discs on an air bearing created by the rotation of the data discs. The data discs have a plurality of data tracks 250, one of which is shown in FIG. 2. The tracks 250 are divided into a plurality of bits. As the disc rotates in the direction of the arrow 252, the read head 200 follows a data track 250 and reads one or more bits as it passes under megnetoresistive sensor 202.

Figure 3:
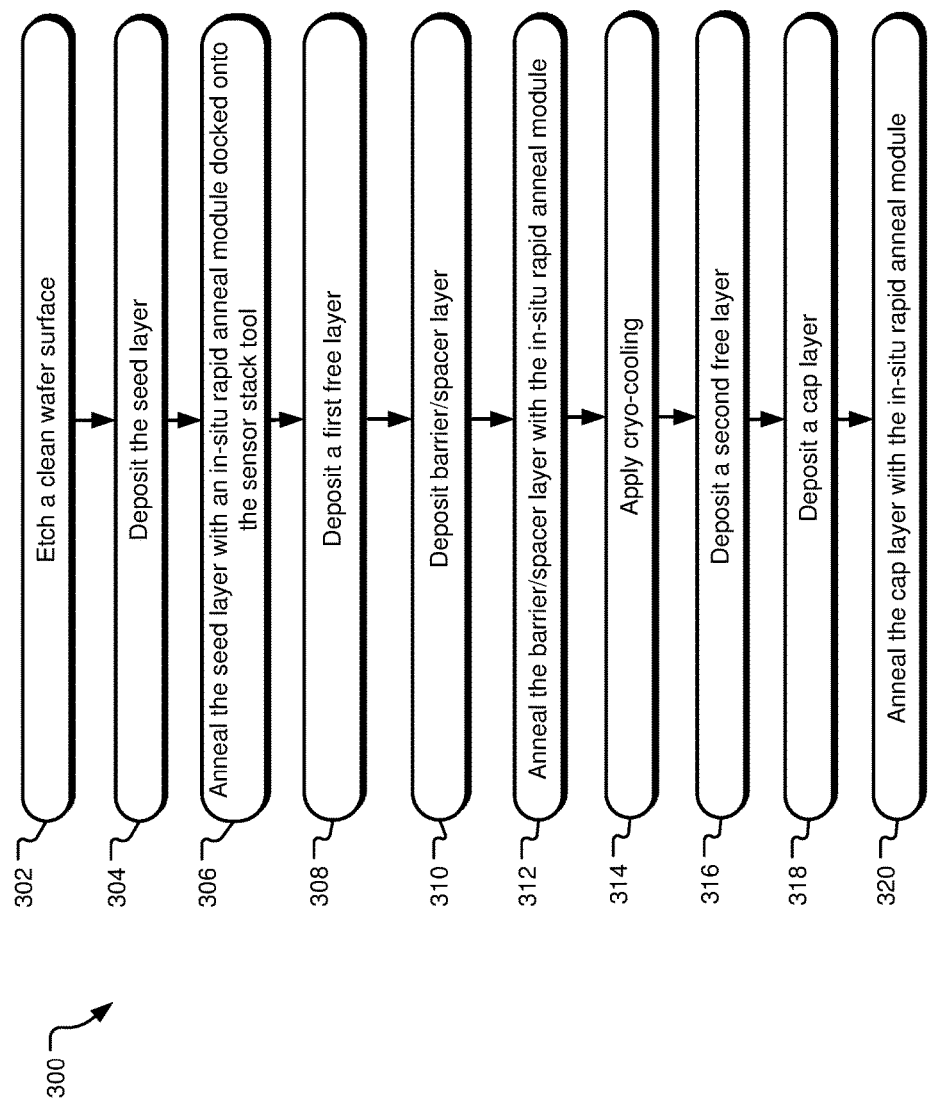
FIG. 3 illustrates example operations illustrating manufacturing a read head including a megnetoresistive sensor.

FIG. 3 illustrates example operations 300 illustrating manufacturing of a read head including a megnetoresistive sensor. Specifically, the operations 300 illustrate a method of manufacturing a megnetoresistive sensor for a trilayer read head. An etching operation 302 etches a clean wafer surface using plasma etching or ion-beam etching technique. Subsequently, a depositing operation 304 deposits a seed layer on the etched wafer surface. In one implementation, an annealing operation 306 anneals the seed layer using in-situ thermal anneal process. For example, such in-situ thermal annealing is provided using an in-situ rapid thermal anneal (RTA) module.

Subsequently, an operation 308 deposits a first free layer on the seed layer. In one implementation, such free layer is not exchange coupled to an antiferromagnet. As a result, the magnetic moment of the free layer is free to rotate under the influence of an applied magnetic field in a range of interest. Subsequently, a depositing operation 310 deposits a barrier layer. In one implementation, the barrier layer is deposited at 200° C. Example barrier layer may be made of MgO material that provides an MTJ. In one implementation, the depositing the MgO layer can be broken up into a sequence of depositions, with first being depositing of an Mg layer, subsequently depositing an MgO layer, and finally depositing another Mg layer. In yet alternative implementation, instead of a barrier layer, a metallic spacer layer is deposited, wherein such metallic spacer layer provides CPP GMR.

An annealing operation 312 performs in-situ rapid thermal annealing of the barrier/spacer layer. Optionally, a cooling operation 314 applies cryo-cooling after the annealing operation. The in-situ rapid thermal annealing of the barrier/spacer layer allows rapid cooling of the annealed layers. Subsequently, a depositing operation 316 deposits a second free layer on the annealed barrier/spacer layer. A cap layer is deposited on top of the second free layer during a depositing operation 318. Finally, an annealing operation 320 anneals the cap layer.

Note that while the operations 300 illustrate applying in-situ thermal annealing of various specific layers, such as the seed layer, the barrier layer, the cap layer, etc., in an alternative implementation not all of these layers are annealed. Furthermore, in yet alternative implementation, other layers of the megnetoresistive sensor may also be annealed after deposition of such layers.

Figure 4:
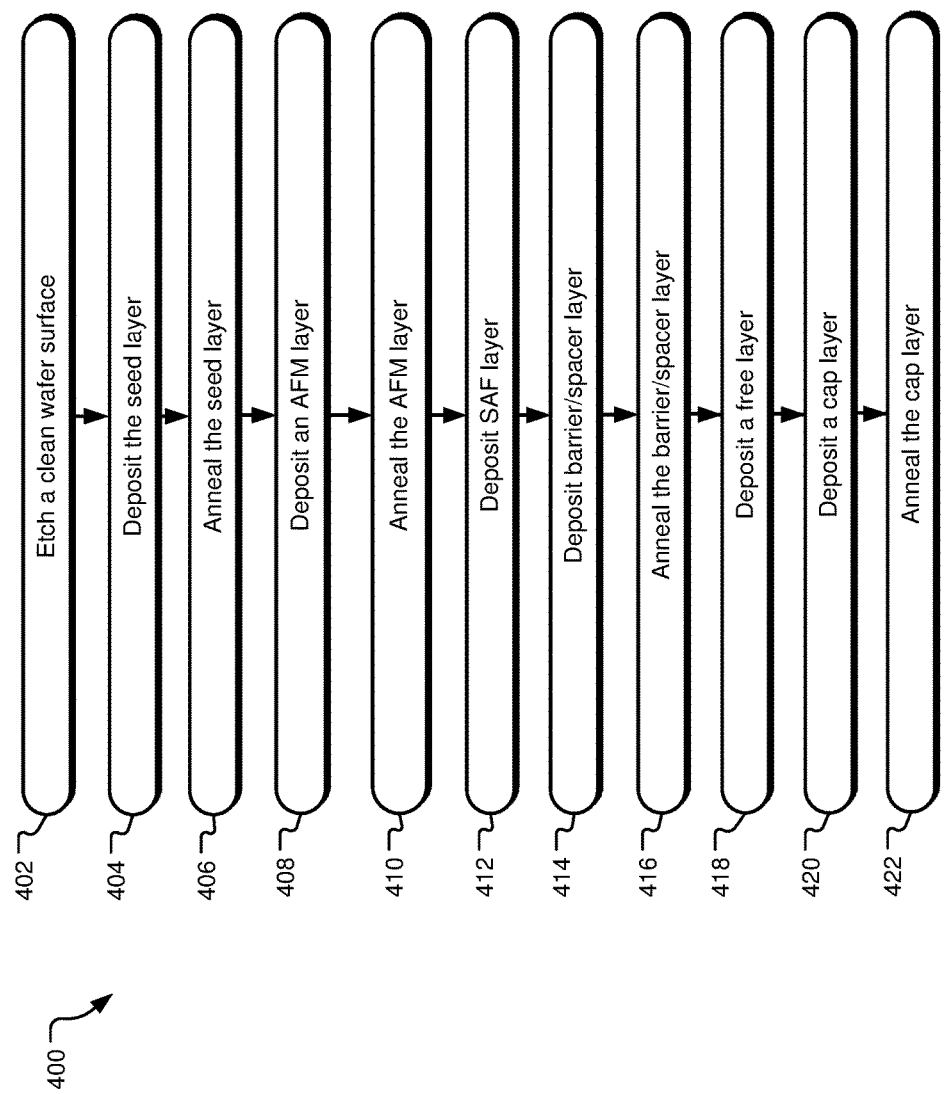
FIG. 4 illustrates alternative example operations illustrating manufacturing a read head including a megnetoresistive sensor.

FIG. 4 illustrates alternative example operations illustrating manufacturing a read head including a megnetoresistive sensor. Specifically, the operations 400 illustrate a method of manufacturing a megnetoresistive sensor for a trilayer read head. An etching operation 402 etches a clean wafer surface using plasma etching or ion-beam etching technique. Subsequently, a depositing operation 404 deposits a seed layer on the etched wafer surface. In one implementation, an annealing operation 406 anneals the seed layer using in-situ thermal anneal process. For example, such in-situ thermal annealing is provided using an in-situ rapid thermal anneal (RTA) module.

Subsequently, a depositing operation 408 deposits an antiferromagnetic (AFM) layer on the seed layer. The AFM layer may be an IrMn layer. Subsequently, the AFM layer is annealed using an in-situ rapid thermal anneal process by an annealing operation 410. The application of in-situ rapid thermal annealing after deposition of an IrMn layer leads to improved pinning Specifically, the in-situ anneal prevents Mn from diffusing and leads to more ordered and clean IrMn layer. After annealing the AFM layer, a depositing operation 412 deposits an SAF layer on the annealed AFM layer.

Subsequently, a depositing operation 414 deposits a barrier layer. In one implementation, the barrier layer is deposited at 200° C. Example barrier layer may be made of MgO material that provides an MTJ. In one implementation, the depositing the MgO layer can be broken up into a sequence of depositions, with first being depositing of an Mg layer, subsequently depositing an MgO layer, and finally depositing another Mg layer. In yet alternative implementation, instead of a barrier layer, a metallic spacer layer is deposited, wherein such metallic spacer layer provides CPP GMR.

An annealing operation 416 performs in-situ rapid thermal annealing of the barrier/spacer layer. Optionally, a cooling operation (not shown) applies cryo-cooling after the annealing operation. The in-situ rapid thermal annealing of the barrier/spacer layer allows rapid cooling of the annealed layers. Subsequently, a depositing operation 418 deposits a free layer on the annealed barrier/spacer layer. A cap layer is deposited on top of the second free layer during a depositing operation 420. Finally, an annealing operation 422 anneals the cap layer.

Note that while the operations 400 illustrate applying in-situ thermal annealing of various specific layers, such as the seed layer, the barrier layer, the cap layer, etc., in an alternative implementation not all of these layers are annealed. Furthermore, in yet alternative implementation, other layers of the megnetoresistive sensor may also be annealed after deposition of such layers.

Annealing one or more layers of a sensor stack at a high temperature using in-situ rapid thermal annealing increases the magnetoresistance (MR) in the MgO based magnetic tunnel junctions (MTJs) and in thin films made of other materials such as ordered Heusler alloys. For example, for MgO based trilayer type sensor stacks, increasing post-deposition anneal temperature to approximately 450 degree centigrade results in substantially increasing the tunneling magnetoresistance (TMR).

Figure 5:
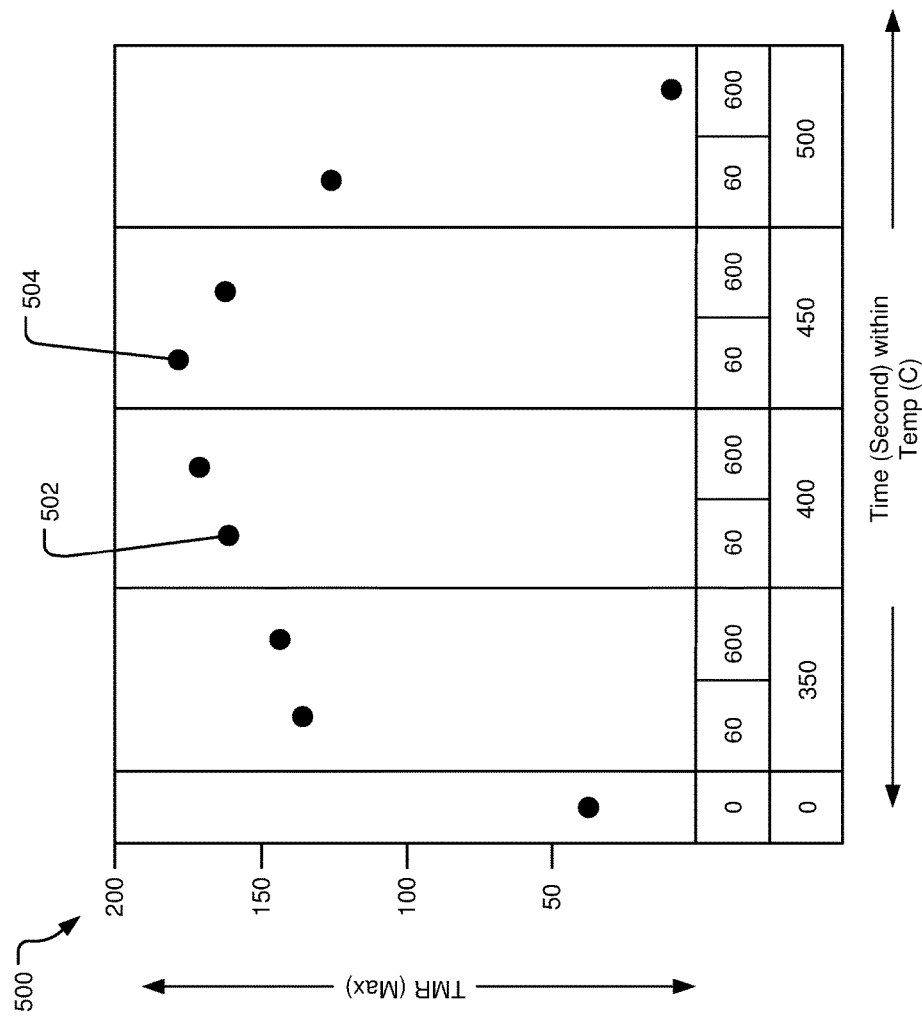
FIG. 5 illustrates a graph illustrating the TMR improvements achieved by the read head manufactured using the process described herein.

FIG. 5 illustrates a graph 500 illustrating the improvement in the TMR achieved by the read head manufactured using the process described herein. Specifically, the graph 500 illustrates the TMR for various combinations of temperature and times for the in-situ rapid thermal annealing (RTA) applied to a layer of a trilayer sensor stack. For example, the graph 500 illustrates that when in-situ RTA is applied with the annealing temperature of 400 degrees centigrade over a soak time of 60 seconds, the TMR 502 of 161 is achieved. When the annealing temperature is increased to 450 degrees centigrade over a soak time of 60 seconds, the TMR 504 increases to 177. As illustrated in FIG. 5, large TMR enhancements are achieved in short time periods by going to temperatures higher than 300 degree centigrade. However, when the annealing temperature is increased to the range of 500 degree centigrade, the TMR declines.

While the TMR data shown in FIG. 5 illustrates improvements in the TMR for a trilayer sensor stack, similar increases in TMR are also observed in other sensor stacks.

Using the in-situ rapid thermal annealing for one or more layers of sensor stacks also allows in using smaller soak time for cooling the annealed layers. The shorter cooling periods result in smaller standard deviations for the resistance area (RA).

Even though the concepts of in-situ thermal anneal in general and the in-situ rapid thermal anneal are discussed above with respect to sensor stacks for read heads, in alternative implementations, these concepts are applied in even broader range of applications in recording head fabrication. For example, in-situ thermal anneals can applied to reader materials including shields, dielectrics for electric isolation, permanent magnets, etc. For writers, in-situ thermal anneals can be applied to any of the magnetic layers that form part of a writer, including the writer, the coil, the dielectrics, the non-magnetic metals, etc. The in-situ anneal process can also be applied in other situations where materials need to anneal but suffer inter-diffusion with capping materials. In these implementations, an in-situ anneal operation is inserted between the deposition of the material in question and the deposition of the capping layer. In such implementations, the fast turn-around times of the in-situ anneal process and in-situ rapid thermal anneal process results in relatively small addition of process time.

Furthermore, the in-situ anneal process disclosed herein can be further expanded to include on-wafer designs that manage the absorption of the infrared radiation from rapid-thermal anneal lamps. For example, in example implementations, reflector layers are put down in order to shield more critical parts of the wafer. Such reflectors can have appropriate thermal design that thermally isolates them from the sensitive parts of the wafer. In yet alternative implementation, the device area that is targeted for anneal can also undergo thermal engineering that provides a thermally connected heat sink with a large thermal mass that functions as a heat sink to enable rapid cooling of the device area once the rapid thermal annealing lamp is turned off. Other manners of heat sink are also provided in alternative implementations.

The above specification, examples, and data provide a complete description of the structure and use of example implementations of the invention. Since many implementations of the invention can be made without departing from the spirit and scope of the invention, the invention resides in the claims hereinafter appended. Furthermore, structural features of the different implementations may be combined in yet another implementation without departing from the recited claims. The implementations described above and other implementations are within the scope of the following claims.

What is claimed is:

1. A method of making a sensor stack, comprising:
   depositing layers of a sensor stack;
   annealing individually at least two layers of the sensor stack using in-situ rapid thermal annealing with an in-situ rapid anneal module docked onto a sensor stack tool after each of the at least two layers of the sensor stack is deposited, wherein one of the annealed layers is an MgO barrier layer deposited between two Mg layers and wherein one of the annealed layers is an antiferromagnetic (AFM) layer; and
   cryo-cooling the MgO barrier layer after the MgO barrier layer is annealed and before an additional layer and a cap layer are deposited on the sensor stack.

2. The method of claim 1 wherein annealing at least two layers of the sensor stack using in-situ rapid thermal annealing comprises annealing a seed layer located at a bottom of the sensor stack adjacent a bottom shield using in-situ rapid thermal annealing.

3. The method of claim 1 wherein annealing at least two layers of the sensor stack using in-situ rapid thermal annealing comprises annealing a metallic spacer layer using in-situ rapid thermal annealing.

4. The method of claim 1 wherein the AFM layer is an IrMn layer.

5. The method of claim 1, further comprising depositing a CoFe pinning layer on top of the annealed AFM layer and annealing the CoFe pinning layer in the sensor stack.

6. The method of claim 1, further comprising depositing an Ru layer and a reference layer on top of a CoFe pinning layer.

7. The method of claim 1, wherein depositing the MgO barrier layer further comprises depositing the MgO barrier layer at a temperature within a range of 200 to 400 degrees centigrade.

* * * * *